United States Patent
Jang et al.

(10) Patent No.: US 12,369,295 B2
(45) Date of Patent: Jul. 22, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Minki Hong, Hefei (CN); Jo-Lan Chin, Hefei (CN); Kyongtaek Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 491 days.

(21) Appl. No.: 17/934,655

(22) Filed: Sep. 23, 2022

(65) Prior Publication Data

US 2023/0345694 A1    Oct. 26, 2023

Related U.S. Application Data

(63) Continuation of application No. PCT/CN2022/109754, filed on Aug. 2, 2022.

(30) Foreign Application Priority Data

Apr. 26, 2022    (CN) .......................... 202210449990.1

(51) Int. Cl.
   *H10B 12/00*    (2023.01)
(52) U.S. Cl.
   CPC ................... *H10B 12/00* (2023.02)
(58) Field of Classification Search
   CPC ...................................... H10B 12/00
   See application file for complete search history.

(56) References Cited

U.S. PATENT DOCUMENTS

| | | | |
|---|---|---|---|
| 8,502,186 | B2 | 8/2013 | Chung |
| 9,147,595 | B2 | 9/2015 | Lee et al. |
| 10,181,472 | B1 | 1/2019 | Huang |
| 10,388,659 | B2 | 8/2019 | Zhang |
| 10,546,862 | B1 | 1/2020 | Yang et al. |
| 11,069,679 | B2 * | 7/2021 | Wu ............. H10D 84/83 |
| 2008/0251825 | A1 | 10/2008 | Lee |

(Continued)

FOREIGN PATENT DOCUMENTS

| CN | 101897008 A | 11/2010 |
|---|---|---|
| CN | 102779828 A | 11/2012 |

(Continued)

OTHER PUBLICATIONS

International Search Report cited in PCT/CN2022/098253 mailed Nov. 30, 2022, 9 pages.

(Continued)

*Primary Examiner* — Allison Bernstein
(74) *Attorney, Agent, or Firm* — Kilpatrick Townsend & Stockton LLP

(57) ABSTRACT

The present disclosure provides a semiconductor structure and a manufacturing method thereof. The semiconductor structure includes: a base, where the base is provided with an array region and a peripheral region, the array region is provided with vertical transistor structures, the vertical transistor structures are arranged in an array in the array region, and the peripheral region surrounds the array region; a first gate layer surrounding the vertical transistor structure and extending along a first direction; a second gate layer surrounding the vertical transistor structure and extending along the first direction, where the second gate layer and the first gate layer surround a same vertical transistor structure, are disposed at intervals, and both extend to the peripheral region; and an electrical connection structure located in the peripheral region and electrically connected to the first gate layer and the second gate layer.

13 Claims, 9 Drawing Sheets

(56) References Cited

U.S. PATENT DOCUMENTS

| | | |
|---|---|---|
| 2011/0012085 A1 | 1/2011 | Deligianni et al. |
| 2011/0121396 A1 | 5/2011 | Lee |
| 2013/0234240 A1 | 9/2013 | Moon et al. |
| 2013/0323920 A1 | 12/2013 | Chang et al. |
| 2016/0247892 A1 | 8/2016 | Masuoka et al. |
| 2018/0248018 A1 | 8/2018 | Park et al. |
| 2019/0035795 A1 | 1/2019 | Boemmels |
| 2019/0067459 A1 | 2/2019 | Balakrishnan et al. |
| 2022/0037483 A1 | 2/2022 | Lowe |
| 2022/0068922 A1 | 3/2022 | Chen et al. |

FOREIGN PATENT DOCUMENTS

| | | |
|---|---|---|
| CN | 103904115 A | 7/2014 |
| CN | 109216278 A | 1/2019 |
| CN | 109712976 B | 2/2021 |
| CN | 113838802 A | 12/2021 |
| CN | 114141712 A | 3/2022 |
| CN | 114203806 A | 3/2022 |
| CN | 114784006 A | 7/2022 |

OTHER PUBLICATIONS

International Search Report cited in PCT/CN2022/109754 mailed Jan. 17, 2023, 9 pages.
International Search Report cited in PCT/CN2022/111403 mailed Jan. 16, 2023, 10 pages.
Non-final office action issued in US corresponding U.S. Appl. No. 17/893,058 mailed on Mar. 13, 2025, 10 pages.
Non-final office action issued in US corresponding U.S. Appl. No. 17/932,418 mailed on Mar. 27, 2025, 18 pages.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/109754, filed on Aug. 2, 2022, which claims the priority to Chinese Patent Application No. 202210449990.1, titled "SEMICONDUCTOR STRUCTURE AND MANUFACTURING METHOD THEREOF" and filed on Apr. 26, 2022. The entire contents of International Application No. PCT/CN2022/109754 and Chinese Patent Application No. 202210449990.1 are incorporated herein by reference.

TECHNICAL FIELD

The present disclosure relates, but is not limited, to a semiconductor structure and a manufacturing method thereof.

BACKGROUND

With the increasingly high integration density of the dynamic memory, while the arrangement manners of transistors in a dynamic memory array structure and the way to reduce the size of individual functional devices in the dynamic memory array structure are studied, it is necessary to consider the effect of small-scale functional devices on the overall electrical performance of the semiconductor structure.

When vertical gate-all-around (GAA) transistors are used as access transistors of the dynamic memory, the area occupied by the GAA transistors can reach $4F^2$ (F: the smallest pattern size available under given process conditions). In principle, this arrangement can improve the density and efficiency, but higher demands are placed on potential control and anti-leakage performance between small-sized functional devices, and higher demands are also placed on the overall electrical performance of the semiconductor structure.

SUMMARY

An overview of the subject described in detail in the present disclosure is provided below. This overview is not intended to limit the protection scope of the claims.

The present disclosure provides a semiconductor structure and a manufacturing method thereof.

A first aspect of the present disclosure provides a semiconductor structure, including: a base, where the base is provided with an array region and a peripheral region, the array region is provided with vertical transistor structures, the vertical transistor structures are arranged in an array in the array region, and the peripheral region surrounds the array region; a first gate layer surrounding the vertical transistor structure and extending along a first direction; a second gate layer surrounding the vertical transistor structure and extending along the first direction, where the second gate layer and the first gate layer surround a same vertical transistor structure, are disposed at intervals, and both extend to the peripheral region; and an electrical connection structure located in the peripheral region and electrically connected to the first gate layer and the second gate layer.

A second aspect of the present disclosure provides a method of manufacturing a semiconductor structure, including: providing a base, where the base is provided with an array region and a peripheral region, the array region is provided with vertical transistor structures, the vertical transistor structures are arranged in an array in the array region, and the peripheral region surrounds the array region; forming a first gate layer surrounding the vertical transistor structure and extending along a first direction; forming a second gate layer surrounding the vertical transistor structure, where the second gate layer and the first gate layer surround a same vertical transistor structure along a direction perpendicular to a top surface of the base, are disposed at intervals, and both extend to the peripheral region; and forming an electrical connection structure located in the peripheral region and electrically connected to the first gate layer and the second gate layer.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It can be known from the background art that while the leakage current in the semiconductor structure is reduced, higher demands are placed on the way to control the potential between small-sized functional devices.

The embodiment of the present disclosure provides a semiconductor structure and a manufacturing method thereof. In the semiconductor structure, a vertical transistor structure is formed in a base. The first gate layer and the second gate layer both surround the vertical transistor structure, so a double-gate semiconductor structure can be formed. The vertical transistor structures are arranged in a $4F^2$ manner, to improve the integration density of the semiconductor structure. Moreover, the first gate layer and the second gate layer are designed to jointly control the same vertical transistor structure, such that the abilities of the first gate layer and the second gate layer to control the vertical transistor structure complement each other. This is beneficial to further enhancing control of the first gate layer and the second gate layer over the vertical transistor structure, thereby effectively suppressing the short channel effect, reducing the leakage current in the vertical transistor structure, and increasing the control current of the first gate layer and the second gate layer to control the vertical transistor structure on the whole. The first gate layer and the second gate layer both extend to the peripheral region, and the potential of the first gate layer and the potential of the second gate layer are controlled through the electrical connection structure in the peripheral region. In this way, the control over the potential of the first gate layer and the potential of the second gate layer can be diversified, and the layout space of the vertical transistor structures in the array region is not affected.

An embodiment of the present disclosure provides a semiconductor structure, to reduce the leakage current of the vertical transistor structure, and control the potentials of the first gate layer and the second gate layer. The semiconductor structure provided by the embodiment of the present disclosure is described in detail with reference to the accompanying drawings.

Figure 1:
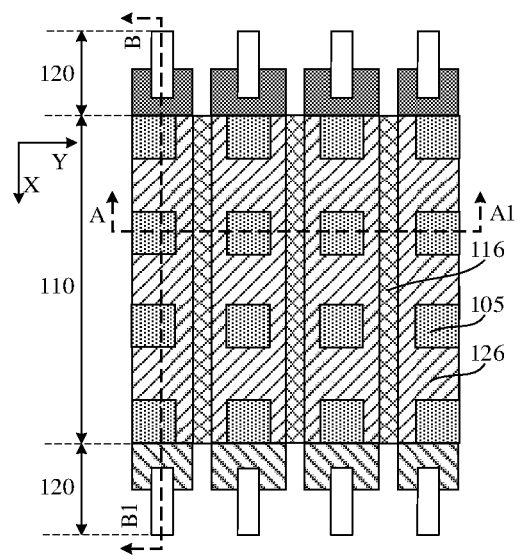
FIG. 1 to FIG. 21 are schematic structural cross-sectional views corresponding to various steps of a method of manufacturing a semiconductor structure according to an embodiment of the present disclosure.
Figure 2:
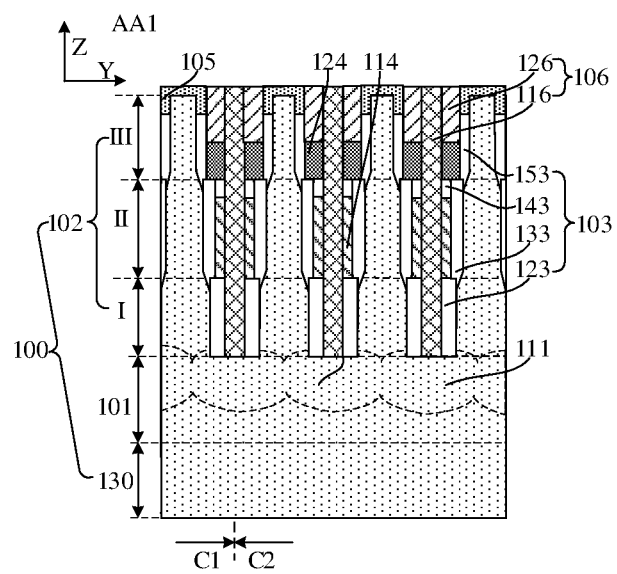
Figure 3:
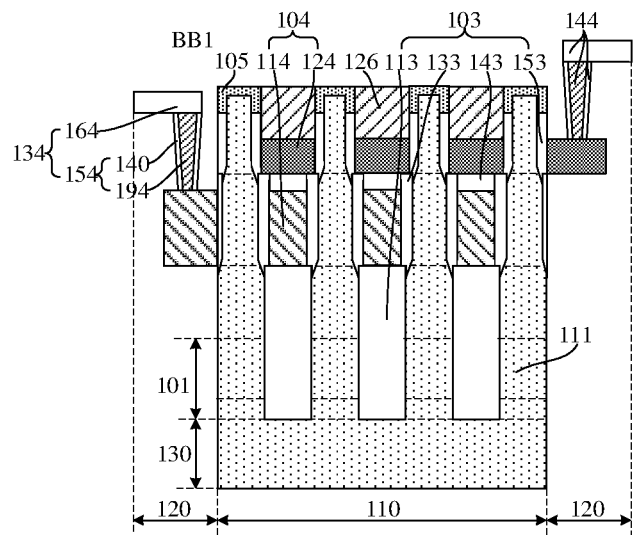
Figure 4:
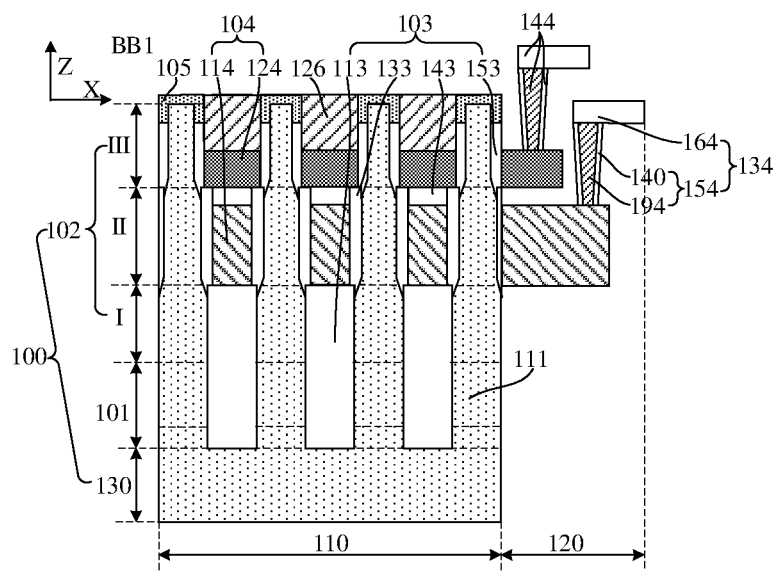
Figure 5:
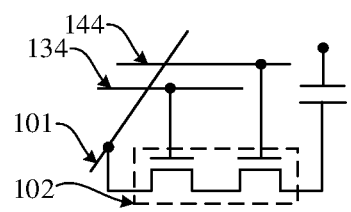
Figure 6:
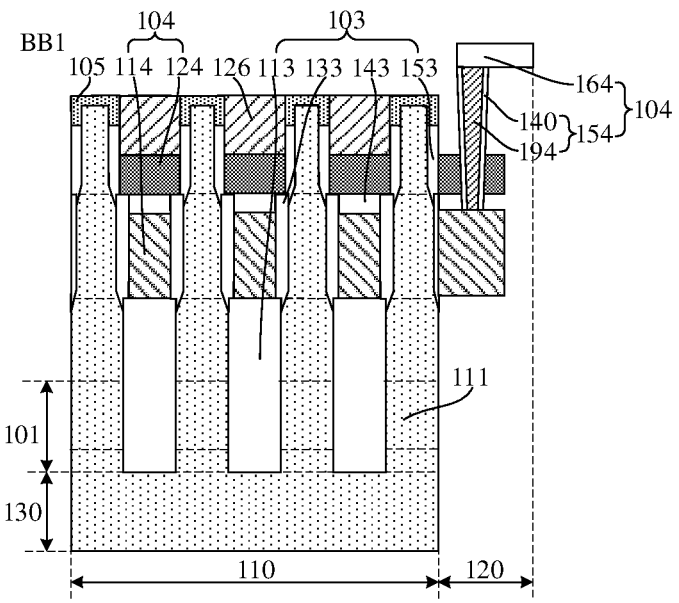
Figure 7:
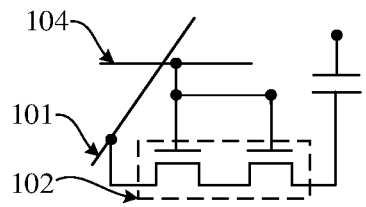
Figure 8:
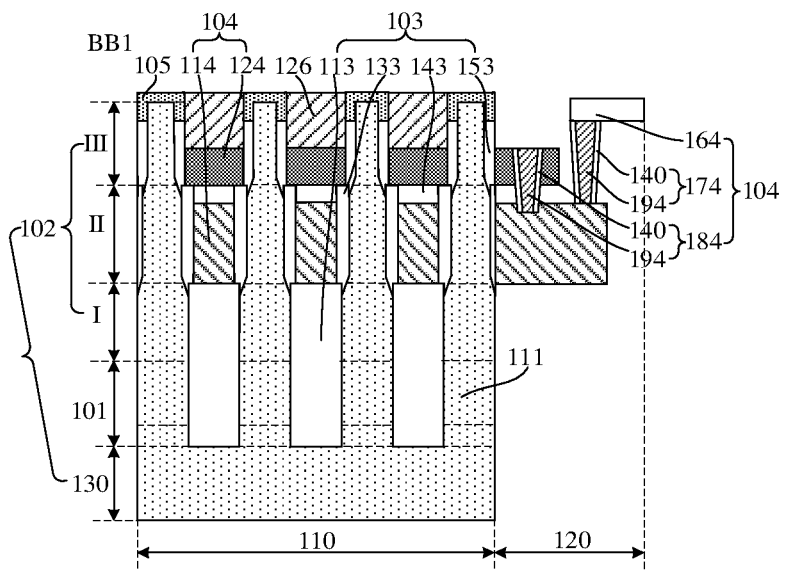
Figure 9:
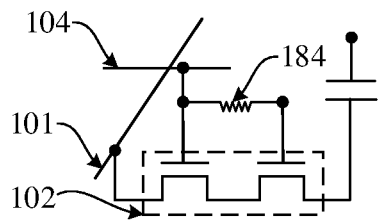
Figure 10:
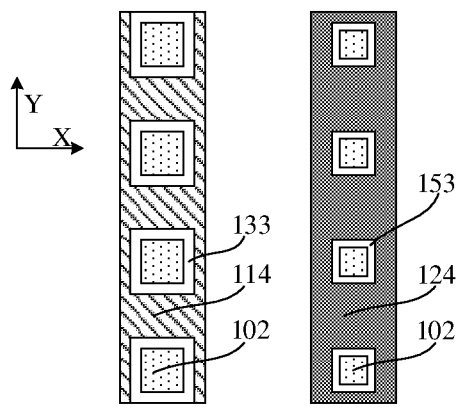

FIG. 1 is a schematic top view of a semiconductor structure according to an embodiment of the present disclosure. FIG. 2 is a schematic cross-sectional view of the semiconductor structure in FIG. 1 along a first cross-sectional direction AA1. FIG. 3 is a schematic cross-sectional view of the semiconductor structure in FIG. 1 along a second cross-sectional direction BB1. FIGS. 4, 6, and 8 are other three schematic cross-sectional views of the semiconductor structure along the second cross-sectional direction BB1 according to an embodiment of the present disclosure. FIG. 5 is a schematic diagram of circuits corresponding to local parts in FIG. 3 and FIG. 4. FIG. 7 is a schematic diagram of a circuit corresponding to a partial structure in FIG. 6. FIG. 9 is a schematic diagram corresponding to a partial structure in FIG. 8. FIG. 10 is a schematic cross-sectional view in which in the semiconductor structure a first gate layer and a second gate layer surround a vertical transistor structure according to an embodiment of the present disclosure. It should be noted that to conveniently describe and clearly illustrate the steps of the method of manufacturing a semiconductor structure, FIGS. 1 to 10 in this embodiment are all schematic partial diagrams of the semiconductor structure. Other structures in the peripheral region of the semiconductor structure are not shown.

With reference to FIGS. 1 to 10, the semiconductor structure includes: a base 100, where the base 100 is provided with an array region 110 and a peripheral region 120, the array region 110 is provided with vertical transistor structures 102, the vertical transistor structures 102 are arranged in an array in the array region 110, and the peripheral region 120 surrounds the array region 110; a first gate layer 114 surrounding the vertical transistor structure 102 and extending along a first direction X; a second gate layer 124 surrounding the vertical transistor structure 102 and extending along the first direction X, where the second gate layer 124 and the first gate layer 114 surround a same vertical transistor structure 102 along a direction Z perpendicular to a top surface of the base 100, are disposed at intervals, and both extend to the peripheral region 120; and an electrical connection structure 104 located in the peripheral region 120 and electrically connected to the first gate layer 114 and the second gate layer 124.

Vertical GAA transistors 102 are formed in the base 100, the first gate layer 114 and the second gate layer 124 both surround the vertical transistor structure 102, such that a double-gate semiconductor structure can be formed, thereby improving the integration density of the conductor structure.

In addition, the first gate layer 114 and the second gate layer 124 are designed to control the same vertical transistor structure 102, such that the capabilities of the first gate layer 114 and the second gate layer 124 to control the vertical transistor structure 102 complement each other. When the lack of the capability for turning off the vertical transistor structure 102 in one of the gate layers results in a large leakage current, such as GIDL (gate-induced drain leakage), the vertical transistor structure 102 is turned off by using another gate layer, thereby ensuring good capabilities of the first gate layer 114 and the second gate layer 124 to control the vertical transistor structure 102 on the whole. This is beneficial to reducing the leakage current in the semiconductor structure, to improve the overall electrical performance of the semiconductor structure. The first gate layer 114 and the second gate layer 124 both extend to the peripheral region 120, and the potential of the first gate layer 114 and the potential of the second gate layer 124 are controlled through the electrical connection structure 104 in the peripheral region 120. In this way, the control over the potential of the first gate layer 114 and the potential of the second gate layer 124 can be diversified, and the layout space of the vertical transistor structures 102 in the array region 110 is not affected.

This embodiment of the present disclosure is described in more detail below with reference to the FIGS. 1 to 10.

In this embodiment, the base 100 may be made of an elemental semiconductor material or a crystalline inorganic compound semiconductor material. The elemental semiconductor material may include silicon or germanium, and the crystalline inorganic compound semiconductor material may include silicon carbide, silicon germanium, gallium arsenide or indium gallium.

In some embodiments, with reference to FIGS. 3 to 5, the electrical connection structure 104 may include: a first electrical connection structure 134 electrically connected to the first gate layer 114 extending to the peripheral region 120; and a second electrical connection structure 144 electrically connected to the second gate layer 124 extending to the peripheral region 120, where the first electrical connection structure 134 and the second electrical connection structure 144 are disposed at intervals. In this way, the first electrical connection structure 134 and the second electrical connection structure 144 control the potential of the first gate layer 114 and the potential of the second gate layer 124 respectively, such that a plurality of potentials between the first gate layer 114 and the second gate layer 124 are combined.

In some embodiments, with reference to FIG. 3, the array region 110 has a first side and a second side that are opposite to each other, the first electrical connection structure 134 may be located in the peripheral region 120 close to the first side, and the second electrical connection structure 144 may be located in the peripheral region 120 close to the second side. In this way, a facing region between the first electrical connection structure 134 and the second electrical connection structure 144 is avoided, and the impact of a parasitic capacitance between the first electrical connection structure 134 and the second electrical connection structure 144 is also avoided.

It should be noted that an example is made in which a first side in FIG. 3 is used as a left side of an array region 110, and a second side is used as a right side of the array region 110. In the practical application, the first side may be used as the right side of the array region 110, and the second side may be used as the left side of the array region 110.

In some other embodiments, with reference to FIG. 4, the array region 110 has a first side and a second side that are opposite to each other, and the first electrical connection structure 134 and the second electrical connection structure 144 may be both located in the peripheral region 120 close to the first side or the second side. In this way, along the first direction X, it is beneficial to saving the layout area occupied by the first electrical connection structure 134 and the second electrical connection structure 144 on the whole.

In some embodiments, as shown in FIG. 4, along the first direction X, a length of the first gate layer 114 in the peripheral region 120 is not the same as a length of the second gate layer 124 in the peripheral region 120. In some other embodiments, the first gate layer in the peripheral region may be as long as the second gate layer in the peripheral region.

In some embodiments, as shown in FIG. 4, the first electrical connection structure 134 and the second electrical connection structure 144 may both include the conductive pillar 154 and the conductive layer 164. The conductive pillars 154 extend along the direction Z perpendicular to the top surface of the base. In the first electrical connection structure 134, the conductive pillar 154 has one end electrically connected to the first gate layer 114, and the other end electrically connected to the conductive layer 164. In the second electrical connection structure 144, the conductive pillar 154 has one end electrically connected to the second gate layer 124 and the other end electrically connected to the conductive layer 164. Furthermore, with reference to FIG. 5, the first electrical connection structure 134 and the second electrical connection structure 144 jointly control a vertical transistor structure 102.

In some embodiments, with reference to FIG. 6 to FIG. 9, a first gate layer 114 and a second gate layer 124 may further be electrically connected to a same electrical connection structure 104. The first gate layer 114 and the second gate layer 124 that are electrically connected to the same electrical connection structure 104 are located in a same gap between adjacent two of the vertical transistor structures 102. In this way, the potential of the first gate layer 114 and the potential of the second gate layer 124 are uniformly controlled by using the same electrical signal.

In some embodiments, with reference to FIG. 6, the electrical connection structure 104 may include a conductive pillar 154 and a conductive layer 164, the conductive pillar 154 extends along a direction Z perpendicular to a top surface of the base 100, the conductive pillar 154 has one end electrically connected to the first gate layer 114, and the other end electrically connected to the conductive layer 164, and the conductive pillar 154 penetrates through the second gate layer 124. In this way, the first gate layer 114 and the second gate layer 124 are controlled by using a same electrical connection structure 104. This is beneficial to reducing the quantity of the electrical connection structures 104 configured to control the first gate layers 114 and the second gate layers 124 in the array region 110, and saving the layout space of the electrical connection structures 104 in the peripheral region 120.

In addition, with reference to FIG. 7, the electrical connection structure 104 controls the vertical transistor structure 102, and the electrical connection structure 104 is electrically connected to the first gate layer 114 (with reference to FIG. 6) and the second gate layer 124 (with reference to FIG. 6).

In some other embodiments, with reference to FIGS. 8 and 9, the electrical connection structure 104 includes, a first conductive pillar 174, a conductive layer 164, and a second conductive pillar 184, where the first conductive pillar 174 has one end electrically connected to the first gate layer 114, and the other end electrically connected to the conductive layer 164; and a second conductive pillar 184, having one end electrically connected to the first gate layer 114, and the other end electrically connected to the second gate layer 124, where the second conductive pillar 184 and the first conductive pillar 174 are disposed at intervals.

In this way, the second conductive pillar 184 may be used as a delay resistor, such that the first gate layer 114 first receives the electrical signal through the conductive layer 164. Then, the second gate layer 124 receives the electrical signal later than the first gate layer 114 through the delay action of the second conductive pillar 184. This is beneficial for the identifying and processing of the amplifier and to improving the accuracy of reading data, when the vertical transistor structure 102 is used subsequently to read data.

In addition, with reference to FIG. 9, the electrical connection structure 104 controls the vertical transistor structure 102, and the electrical connection structure 104 is first electrically connected to the first gate layer 114 (with reference to FIG. 8) and then is electrically connected to the second gate layer 124 (with reference to FIG. 8) through the second conductive pillar 184.

In some other embodiments, as shown in FIG. 6, the electrical connection structure 104 includes a conductive pillar 154 and a conductive layer 164, the conductive pillar 154 has one end electrically connected to the first gate layer 114 and/or the second gate layer 124, and the other end electrically connected to the conductive layer 164. It should be noted that the first conductive pillar 174 and the second conductive pillar 184 in FIG. 8 are each a specific representation of the conductive pillar 154. When the conductive pillar 154 is electrically connected to the first gate layer 114, the end surface of the conductive pillar 154 may be electrically connected to the surface of the first gate layer 114, or a partial or entire conductive pillar 154 embedded into the first gate layer 114 may be electrically connected to the first gate layer 114. Similarly, when the conductive pillar 154 is electrically connected to the second gate layer 124, the end surface of the conductive pillar 154 may be electrically connected to the surface of the second gate layer 124, a partial or entire conductive pillar 154 embedded into the second gate layer 124 may be electrically connected to the second gate layer 124. In the embodiments of the present disclosure, the specific manner in which the conductive pillar 154 is in electrical contact with the first gate layer 114 and the second gate layer 124 is not limited.

With reference to FIGS. 3, 4, 6, and 8, the conductive pillar 154 includes: a connecting pillar 194 and a protective layer 140 surrounding a sidewall of the connecting pillar 194. The connecting pillar 194 and the protective layer 140 are made of different materials. The material of the connecting pillar 194 may be tungsten, and the material of the protective layer 140 may be titanium nitride. In this way, the diffusion of tungsten is prevented. The process for preparing the connecting pillar 194 with the tungsten material and preparing the protective layer 140 with the titanium nitride material is mature, and therefore the conductive pillar 154 formed has good conductive property.

In some embodiments, with reference to FIGS. 1 to 10, the base 100 in the array region 110 further includes bit lines 101 arranged at intervals, the bit line 101 extends along a second direction Y, the vertical transistor structure 102 is located on a partial top surface of the bit line 101, in a direction perpendicular to the top surface of the bit line 101, the vertical transistor structure 102 includes a first region I, a second region II, and a third region III that are arranged sequentially, and the first direction X and the second direction Y are different; and the semiconductor structure further includes: a dielectric layer 103 located between adjacent two of the bit lines 101 and on a sidewall of the vertical transistor structure 102, the first gate layer 114 surrounds the dielectric layer 103 in the second region II, and the second gate layer 124 surrounds the dielectric layer 103 in the third region III.

In some embodiments, with reference to FIGS. 2 to 8, the dielectric layer 103 may include: a first dielectric layer 113 located between adjacent bit lines 101 and between the vertical transistor structures 102 of the first regions I on the adjacent bit lines 101; the second dielectric layer 123 located on the sidewall of the vertical transistor structure 102 in the first region I and the sidewall of the first dielectric layer 113 in the first region I; the third dielectric layer 133 surrounding the sidewall of the vertical transistor structure 102 in the second region II; a fourth dielectric layer 143 located between the third dielectric layer 133 and the insulating layer 106 and spaced between the first gate layer 114 and the second gate layer 124; and the fifth dielectric layer 153, where the fifth dielectric layer and the electrical connection layer 105 jointly cover the surface of the vertical transistor structure 102 in the third region III.

As shown in FIGS. 2 and 3, the first dielectric layer 113 between adjacent bit lines 101 is configured to electrically insulate adjacent bit lines 101. The first dielectric layer 113 and the second dielectric layer 123 between the vertical transistor structures 102 in the first regions I on adjacent bit lines 101 work together, to electrically insulate the vertical transistor structures 102 in the first region I spaced along the first direction X and/or the second direction Y. The third dielectric layer 133 surrounding the sidewall of the vertical transistor structure 102 in the second region II may be configured to isolate the first gate layer 114 from the vertical transistor structure 102 in the second region II. The third dielectric layer 133 and the fourth dielectric layer 143 may be configured to jointly isolate the first gate layer 114 and the second gate layer 124. The fifth dielectric layer 153 surrounding the surface of the vertical transistor structure 102 in the third region III is configured to electrically insulate the vertical transistor structures 102 in the third region III spaced along the first direction X and/or the second direction Y.

In some embodiments, with reference to FIG. 2, the third dielectric layer 133 may further be located on a partial sidewall of the second dielectric layer 123, which is beneficial to further ensuring the insulation between the first gate layer 114 and the vertical transistor structure 102. The fifth dielectric layer 153 may further be located on a partial sidewall of the third dielectric layer 133, which is beneficial to further ensuring the insulation between the second gate layer 124 and the vertical transistor structure 102.

In some embodiments, as shown in FIGS. 2 and 3, the first dielectric layer 113, the second dielectric layer 123, the third dielectric layer 133, the fourth dielectric layer 143, and the fifth dielectric layer 153 may be made of a same material, such as, silicon oxide. In another embodiment, the five dielectric layers may be made of different materials, provided that these materials have good insulating effects.

With reference to FIG. 2, the vertical transistor structure 102, the dielectric layer 103 surrounding the sidewall of the vertical transistor structure, the first gate layer 114, and the second gate layer 124 form a vertical GAA transistor. The base 100 includes a substrate 130, and the bit line 101 is located between the substrate 130 and the GAA transistor, such that a double-stack semiconductor structure can be formed, which is beneficial to improving the integration density of the semiconductor structure.

It should be noted that, the first region I and the third region III may be both used as the source or drain of the GAA transistor, and the first gate layer 114 and the second gate layer 124 are configured to control the turn-on/off of the GAA transistor.

In some embodiments, as shown in FIGS. 1 and 2, the first direction X is perpendicular to the second direction Y, such that the vertical transistor structures 102 are arranged in a $4F^2$ manner (F: the smallest pattern size available under given process conditions), which is beneficial to improving the integration density of the semiconductor structure. In the practical application, the first direction X only needs to intersect the second direction Y, and the angle between the two may not be 90°.

It should be noted that, a plurality of spaced-apart bit lines 101 may be formed in the base 100, and the bit lines 101 each may be in contact with at least one first region I. FIGS. 1, 4, 6, and 8 show four spaced-apart bit lines 101, where the bit lines 101 each are in contact with four first regions I. In the practical application, the quantity of the bit lines 101 and the quantity of the first regions I in contact with each of the bit lines 101 may be set properly according to actual electrical requirements.

In some embodiments, as shown in FIG. 4, the base 100 includes bit lines 101 and vertical transistor structures 102. If the base 100, the bit lines 101 and the vertical transistor structures 102 have the same semiconductor element, the vertical transistor structure 102 and the bit line 101 may be formed by using the same film structure. The film structure is composed of the semiconductor element, such that the vertical transistor structure 102 and the bit line 101 are integrated, thereby avoiding an interface state defect between the vertical transistor structure 102 and the bit line 101 and improving the performance of the semiconductor structure.

The semiconductor element may include at least one selected from the group consisting of silicon, carbon, germanium, arsenic, gallium and indium. Subsequent description is made by using an example in which both the bit line 101 and the vertical transistor structure 102 both include the silicon element.

In some embodiments, the vertical transistor structure 102 may include doping elements, which is beneficial to improving the conductivity of the vertical transistor structure 102. Therefore, this is beneficial to reducing the turn-on voltage between the first region I and the third region III, that is, the turn-on voltage between the source and the drain of the GAA transistor. The doping element is a P-type doping element or an N-type doping element. Specifically, the N-type doping element may be at least one of arsenic, phosphorus, or antimony; and the P-type doping element may be at least one of boron, indium, or gallium.

In some embodiments, the GAA transistor may be a junctionless transistor, that is, the doping elements in the first region I, the second region II, and the third region III are of the same type. The "junctionless" here refers to no PN junction, that is, the first region I, the second region II, and the third region III are doped with elements of the same concentration. In this way, there is no need to perform additional doping in the first region I and the third region III, thereby avoiding the problem that the doping process in the first region I and the third region III is difficult to control.

Especially as the size of the transistor is further reduced, if the first region I and the third region III are additionally doped, the doping concentration will become more difficult to control. In addition, because the device is a junctionless transistor, it avoids the use of an ultra-steep source/drain doping process to make an ultra-steep PN junction in a nanoscale range. Therefore, problems such as threshold voltage drift and leakage current increase caused by abrupt changes in the doping concentration can be avoided, and the short channel effect can be suppressed. Such a design further improves the integration density and electrical performance of the semiconductor structure. Understandably, the additional doping herein refers to doping to make the types of the doping elements in the first region I and the third region III different from that of the doping element in the second region II.

The first gate layer 114 and the second gate layer 124 are specifically described in detail below with reference to FIGS. 2 to 7.

In some embodiments, with reference to FIGS. 2 to 8, in a plane perpendicular to the sidewall of the vertical transistor structure 102, the vertical transistor structure 102 surrounded by the first gate layer 114 has a first cross section, that is, the second region II has a first cross section. The vertical transistor structure 102 surrounded by the second gate layer 124 has a second cross section, that is, the third region III has a second cross section. The area of the first cross section is greater than that of the second cross section. In this way, the cross-sectional area of the third region III is smaller, which is beneficial to improving the ability of the second gate layer 124 to control the vertical transistor structure 102. In other words, the smaller the threshold voltage required, the easier it is to turn on or off the vertical transistor structure 102. This is further beneficial to adjusting the ability of the second gate layer 124 to control the vertical transistor structure 102 to compensate for the instability of the ability of the first gate layer 114 to control the vertical transistor structure 102, thereby ensuring the overall controllability over the vertical transistor structure 102, to improve the overall electrical performance of the semiconductor structure.

The ratio of the area of the first cross section to that of the second region may be 1.5 to 2.5.

In some embodiments, with reference to FIGS. 2 to 8, in a plane perpendicular to the sidewall of the vertical transistor structure 102, a cross-sectional area of the vertical transistor structure 102 in the first region I, a cross-sectional area of the vertical transistor structure 102 in the second region II, and the cross-sectional area of the vertical transistor structure 102 in the third region III are decreased sequentially.

With reference to FIG. 2, along the second direction Y, the side surface of the second gate layer 124 away from the sidewall of the vertical transistor structure 102 is flush with that of the first gate layer 114 away from the sidewall of vertical transistor structure 102. In this way, the overall volume of the second gate layer 124 is increased, to improve the conductivity of the second gate layer 124, thereby improving the ability of the second gate layer 124 to receive electrical signals, such that on/off of the vertical transistor structure 102 can be controlled by applying a smaller voltage to the second gate layer 124, to improve the on/off sensitivity of GAA transistors.

In some embodiments, with reference to FIG. 2, in directions perpendicular to the sidewalls of the vertical transistor structure 102, that is, along the first direction X and the second direction Y, the first gate layer 114 is thinner than the second gate layer 124. Along the direction Z from the bit line 101 to the vertical transistor structure, the first gate layer 114 is higher than the second gate layer 124. In this way, the gap between vertical transistor structures 102 is properly used to design the dimensions of the first gate layer 114 and the second gate layer 124, to reduce the difference between the volume of the first gate layer 114 and the volume of the second gate layer 124, such that both the first gate layer 114 and the second gate layer 124 each have a suitable volume. This is beneficial to reducing the difference between the conductivity of the first gate layer 114 and the conductivity of the second gate layer 124, to reduce the difference in the abilities of the first gate layer 114 and the second gate layer 124 to control the vertical transistor structure 102, thereby ensuring good ability of the first gate layer 114 and the second gate layer 124 to control the vertical transistor structure 102 on the whole, reducing the leakage current in semiconductor structures, and improving the overall electrical performance of the semiconductor structure.

In addition, with reference to FIG. 2, along the direction Z, the first gate layer 114 may be higher than the second gate layer 124, such that the first gate layer 114 has a larger area to surround the vertical transistor structure 102, thereby improving the ability of the first gate layer 114 to control the vertical transistor structure 102. The ratio of the length of the first gate layer 114 to that of the second gate layer 124 may be 1.5 to 4.

In some embodiments, with reference to FIG. 10, a single first gate layer 114 extends along the second direction Y and surrounds adjacent vertical transistor structures 102 on adjacent bit lines 101 (with reference to FIG. 8). A single second gate layer 124 extends along the second direction Y and surrounds adjacent vertical transistor structures 102 on adjacent bit lines 101 (with reference to FIG. 8).

Both materials of the first gate layer 114 and the material of the second gate layer 124 may include at least one selected from the group consisting of polysilicon, titanium nitride, tantalum nitride, copper or tungsten.

In some embodiments, as shown in FIG. 8, the vertical distance between the top surface of the first gate layer 114 away from the bit line 101 and the bottom surface of the second gate layer 124 close to the bottom surface of the bit line 101 may be 20 nm to 60 nm. In this way, a large parasitic capacitance is avoided between the first gate layer 114 and the second gate layer 124, mutual interference between the first gate layer 114 and the second gate layer 124 is reduced. This is beneficial to ensuring good abilities of the first gate layer 114 and the second gate layer 124 to control the vertical transistor structure 102.

In some embodiments, with reference to FIGS. 1 to 8, the semiconductor structure may further include an electrical connection layer 105 covering a top surface of the third region III and extending to a partial sidewall of the vertical transistor structure 102, where the electrical connection layer 105 and the dielectric layer 103 jointly cover a surface of the vertical transistor structure 102.

As shown in FIG. 8, the electrical connection layer 105 not only covers the top surface of the third region III of the vertical transistor structure 102, but also extends to a partial sidewall of the vertical transistor structure 102, which therefore is beneficial to increasing the contact area between the electrical connection layer 105 and the third region III, reducing the contact resistance between the electrical connection layer 105 and the third region III, and improving the transmission performance of electrical signals between the electrical connection layer 105 and the third region III, thereby improving electrical properties of the semiconductor structure. In some embodiments, the material of the electrical connection layer 105 may include at least one of conductive materials such as titanium, titanium nitride, and tungsten.

In some embodiments, as shown in FIG. 8, along a direction Z from the bit line 101 to the vertical transistor structure 102, the electrical connection layer 105 on the top surface of the third region III is 5 nm to 50 nm. In this way, while having good conductivity, the electrical connection layer 105 has an appropriate size, thereby avoiding taking up too much space in the semiconductor structure.

In some embodiments, with reference to FIGS. 1 and 2, along the directions perpendicular to the sidewalls of the vertical transistor structure 102, that is, in the first direction X and the second direction Y, the ratio of the width of the electrical connection layer 105 located on the sidewall of the vertical transistor structure 102 to that of the vertical transistor structure 102 in the third region III is ⅕ to ⅗. In an example, along a direction perpendicular to the sidewall of the vertical transistor structure 102, the width of the electrical connection layer 105 located on the sidewall of the vertical transistor structure 102 may be 5 nm to 50 nm.

In some embodiments, with reference to FIG. 2, along the direction Z from the bit line 101 to the vertical transistor structure 102, a ratio of the height of the electrical connection layer 105 on the sidewall the vertical transistor structure 102 to that of the vertical transistor structure 102 in the third region III is ⅕ to ⅗. In an example, along the direction Z, the height of the electrical connection layer 105 located on the sidewall of the vertical transistor structure 102 may be 5 nm to 50 nm.

In some embodiments, with reference to FIG. 2, orthographic projection of the electrical connection layer 105 on the bit line 101 is not overlapped or partially overlapped with orthographic projection of the second gate layer 124 on the bit line 101. In an example, the orthographic projection of the electrical connection layer 105 on the bit line 101 is not overlapped with that of the second gate layer 124 on the bit line 101. This is beneficial to avoiding that the electrical connection layer 105 faces the second gate layer 124 in the direction Z, to reduce the mutual interference between the electrical connection layer 105 and the second gate layer 124, such as a parasitic capacitance between the electrical connection layer 105 and the second gate layer 124, thereby improving the electrical performance of the semiconductor structure. In another example, the orthographic projection of the electrical connection layer 105 on the bit line 101 is partially overlapped with the orthographic projection of the second gate layer 124 on the bit line 101. This is beneficial to reducing the facing area between the electrical connection layer 105 and the second gate layer 124, to reduce the mutual interference between the electrical connection layer 105 and the gate structure 124, thereby improving the electrical property of the semiconductor structure.

In some embodiments, with reference to FIGS. 2 to 8, the semiconductor structure may further include: an insulating layer 106 located between adjacent vertical transistor structures 102 on a same bit line 101, and the insulating layer 106 isolates the first gate layers 114 and the second gate layers 124 on adjacent dielectric layers 103.

It should be noted that when the semiconductor structure has the electrical connection layer 105, the insulating layer 106 isolates the electrical connection layers 105 located on adjacent dielectric layers 103.

In some embodiments, with reference to FIG. 2, the insulating layer 106 includes: a first insulating layer 116 located between the dielectric layers 103, the first gate layers 114, and the second gate layers 124 on adjacent vertical transistor structures 102 and extending along the first direction X, where the top surface of the first insulating layer 116 is not lower than the that of the vertical transistor structure 102 in the third region III; and a second insulating layer 126 located on the top surface of the second gate layer 124 away from the bit line 101 and between the first insulating layer 116 and the electrical connection layer 105.

The first insulating layer 116 and the second insulating layer 126 work together, along the second direction Y, to electrically insulate adjacent vertical transistor structures 102, adjacent first gate layers 114, and adjacent second gate layers 124. In addition, the second insulating layer 126 on the top surface of the second gate layer 124 can electrically insulate the second gate layer 124 from another conductive structure.

In some embodiments, the first insulating layer 116 and the second insulating layer 126 may be made of a same material, such as silicon nitride. In another embodiment, the two insulating layers may be made of different materials, provided that these materials have good insulating effects. In the same etching process, a high etch selectivity of a material of the insulating layer 106 to that of the dielectric layer 103 exists.

In some embodiments, with reference to FIGS. 2 to 8, the semiconductor structure may further include a metal-semiconductor compound structure 111 at least located in a bit line 101 opposite to a bottom of the insulating layer 106. The metal-semiconductor compound structure 111 has a smaller resistivity than an unmetallized semiconductor material. Therefore, compared to the vertical transistor structure 102, the bit line 101 including the metal-semiconductor compound structure 111 has a smaller resistivity. This reduces the resistance of the bit lines 101 and the contact resistance between the bit lines 101 and the vertical transistor structure 102 of the first region I, thereby further improving the electrical performance of the semiconductor structure. In addition, the resistivity of the bit lines 101 may further be smaller than that of the substrate 130.

It should be noted that in some embodiments, a region of the bit line 101 under the first region I may be made of a semiconductor material, and a partial region of the bit line 101 that is not covered by the first region I is made of a metal semiconductor compound. It may be understood that as the size of the device continues to shrink and the manufacturing process parameters are adjusted, a partial region of the bit line 101 under the first region I is made of a semiconductor material, and the remaining region of the bit line 101 under the first region I may also be made of a metal semiconductor compound. The "remaining region" here is located on a periphery of the "partial region".

For example, with reference to FIG. 2, the plurality of metal-semiconductor compound structures 111 in the bit line 101 communicate with each other to form a part of the bit line 101. Moreover, the metal-semiconductor compound structure 111 may be partially located in the bit line 101 and partially located in the vertical transistor structure 102 in the first region I. In other embodiments, a plurality of metal-semiconductor compound structures in the same bit line may be spaced from each other.

In FIG. 2, the region of the base 100 defined by a dotted ellipse is a metal-semiconductor compound structure 111. In the practical application, the size of the contact region between adjacent metal-semiconductor compound structures 111 is not limited. In other embodiments, the entire bit line may be used as the metal-semiconductor compound structure.

In some embodiments, along a direction from the vertical transistor structures 102 at two sides of the insulating layer 106 to the insulating layer 106, that is, in the directions C1 and C2, the metal-semiconductor compound structure 111 becomes deeper.

An example in which the semiconductor element is silicon is made below. The material of the metal-semiconductor compound structure 111 includes at least one selected from the group consisting of cobalt silicide, nickel silicide, molybdenum silicide, titanium silicide, tungsten silicide, tantalum silicide and platinum silicide.

In summary, the first gate layer 114 and the second gate layer 124 jointly control the same vertical transistor structure 102, thereby effectively suppressing the short channel effect, reducing the leakage current in the vertical transistor structure, and increasing the control current of the first gate layer 114 and the second gate layer 124 to control the vertical transistor structure 102 on the whole. The first gate layer 114 and the second gate layer 124 both extend to the peripheral region 120, and the potential of the first gate layer 114 and the potential of the second gate layer 124 are controlled through the electrical connection structure 104 in the peripheral region 120. In this way, the control over the potential of the first gate layer 114 and the potential of the second gate layer 124 can be diversified, and the layout space of the vertical transistor structures 102 in the array region 110 is not affected.

Another embodiment of the present application further provides a method of manufacturing a semiconductor structure, which is used to prepare the semiconductor structure in the above embodiment. The method of manufacturing a semiconductor structure provided by another embodiment of the present disclosure is described in detail below with reference to the accompanying drawings.

FIG. 11 to FIG. 21 are schematic structural cross-sectional views corresponding to various steps of a method of manufacturing a semiconductor structure according to another embodiment of the present disclosure. The method of manufacturing a semiconductor structure provided by another embodiment is described in detail below with reference to the drawings.

It should be noted that to facilitate the description and clearly illustrate the steps of the method of manufacturing a semiconductor structure, FIGS. 11 to 21 in this embodiment are all partial schematic structural diagrams of the semiconductor structure. One or both of the sectional view along the first sectional direction AA1 and the sectional view along the second sectional direction BB1 are set later according to the description requirements. In addition, parts that are the same as or corresponding to the foregoing embodiment are not described herein again.

Figure 11:
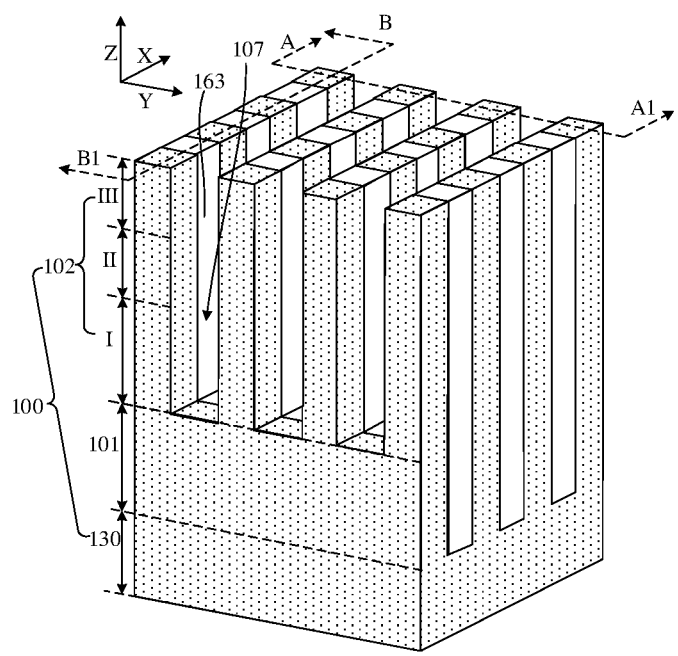

With reference to FIG. 11, the method of manufacturing the semiconductor structure includes: providing a base 100, where the base 100 is provided with an array region 110 (with reference to FIG. 1) and a peripheral region 120 (with reference to FIG. 1), the array region 110 is provided with vertical transistor structures 102, the vertical transistor structures 102 are arranged in an array in the array region 110, and the peripheral region 120 surrounds the array region 110.

In some embodiments, with reference to FIG. 11, the base 100 in the array region 110 further includes bit lines 101 arranged at intervals, the bit line 101 extends along a second direction Y, the vertical transistor structure 102 is located on a partial top surface of the bit line 101, in a direction Y perpendicular to the top surface of the bit line 101, the vertical transistor structure 102 includes a first region I, a second region II, and a third region III that are arranged sequentially, and the first direction X and the second direction Y are different.

It should be noted that both the first region I and the third region III may be used as the source or drain of the subsequently formed GAA transistor having the vertical transistor structure 102. A part of the second region II corresponds to the first gate layer 114 of the GAA transistor formed subsequently, and a part of the third region III corresponds to the second gate layer 124 of the GAA transistor formed subsequently.

The step of providing the base 100 may include: providing an initial base (not shown in the figure), where the initial first dielectric layer (not shown in the figure) extending along the second direction X is disposed in the initial base; with reference to FIGS. 11, patterning the initial base and the initial first dielectric layer, to form the bit lines 101 arranged at intervals, the vertical transistor structures 102, and the initial first dielectric layers 163 located between adjacent bit lines 101, where a top surface of the initial first dielectric layer 163 is not lower than that of the vertical transistor structure 102, the sidewall of the vertical transistor structure 102, a sidewall of the initial first dielectric layer 163, and the partial top surface of the bit line 101 define a trench 107, and the trench 107 extends along the first direction X.

In some embodiments, doping treatment and annealing treatment may also be performed on the initial base, such that the initial base is doped with N-type doping elements or P-type doping elements. This is beneficial to improving the conductivity of the vertical transistor structure 102 formed on the basis of the initial base, thereby reducing the turn-on voltage between the first region I and the third region III, that is, reducing the turn-on voltage between the source and the drain of the GAA transistor formed subsequently. In addition, the initial base is doped with N-type doping elements or P-type doping elements to improve the conductivity of the bit line 101 formed on the basis of the initial base, thereby reducing the contact resistance between the first region I and the bit line 101, and improving the electrical property of the semiconductor structure.

With reference to FIGS. 12 to 21, a first gate layer 114 is formed. The first gate layer 114 surrounds the vertical transistor structure 102 and extends along a first direction X. A second gate layer 124 is formed and surrounds the vertical transistor structure 102. Along a direction Z perpendicular to the top surface of the base 100, the second gate layer 124 and the first gate layer 114 surround a same vertical transistor structure 102. The second gate layer 124 and the first gate layer 114 are spaced apart. The first gate layer 114 and the second gate layer 124 both extend to the peripheral region 120. An electrical connection structure 104 is formed in the peripheral region 120, and is electrically connected to the first gate layer 114 and the second gate layer 124.

In some embodiments, with reference to FIGS. 12 to 15, the step of forming the first gate layer 114 and the second gate layer 124 may include the following steps.

Figure 13:
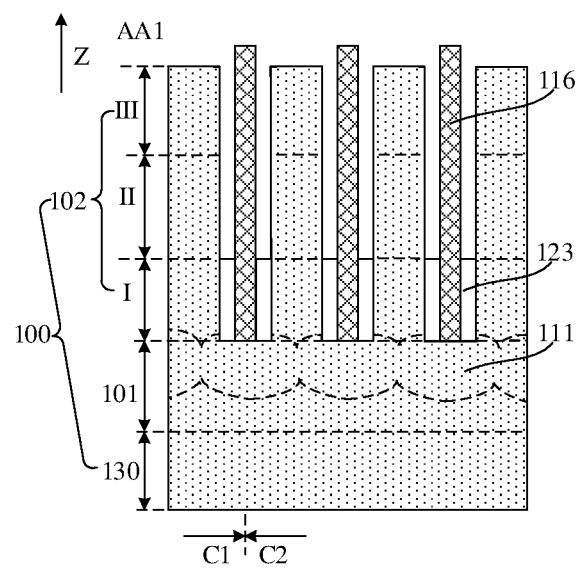

With reference to FIG. 13, a second dielectric layer 123 is formed on a sidewall of the trench 107 (with reference to FIG. 11) in the first region I. A first insulating layer 116 is formed and located in the trench 107, and isolates adjacent second dielectric layers 123. The top surface of the first insulating layer 116 is not lower than the top surface of the vertical transistor structure 102, which facilitates the subsequent formation of second gaps between the first insulating layer 116 and the vertical transistor structures 102 in the second region II and the third region III. Then, the first gate layer and the second gate layer with precise dimensions can be formed in the second gaps through self-alignment. This is beneficial to simplifying the formation steps of the first gate layer and the second gate layer, and the size of the second gap is adjusted to obtain the first gate layer and the second gate layer in a small size.

Figure 12:
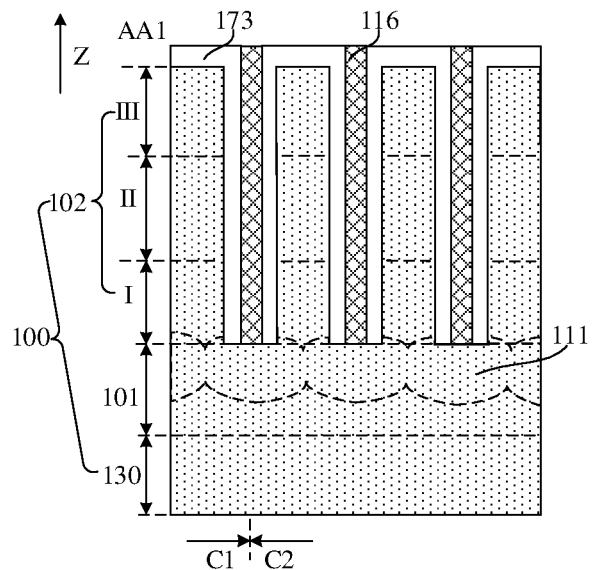

In some embodiments, with reference to FIGS. 11 to 13, after the trench 107 is formed and before the second dielectric layer 123 is formed, metal silicidation may be performed on a part of the top surface of the bit line 101 exposed by the trench 107 to form a metal-semiconductor compound structure 111. The material of the metal layer includes at least one of cobalt, nickel, molybdenum, titanium, tungsten, tantalum and platinum. In other embodiments, the metal silicidation may not be performed on the exposed top surface of the bit line, and the second dielectric layer and the first insulating layer may be directly formed on the exposed top surface of the bit line.

Then, with reference to FIGS. 14 to 17, the initial first dielectric layer 163 (with reference to FIG. 11) and the initial second dielectric layer 173 (with reference to FIG. 12) are etched by using the first insulating layer 116 as a mask to form the first dielectric layer 113 and the second dielectric Layer 123.

Figure 14:
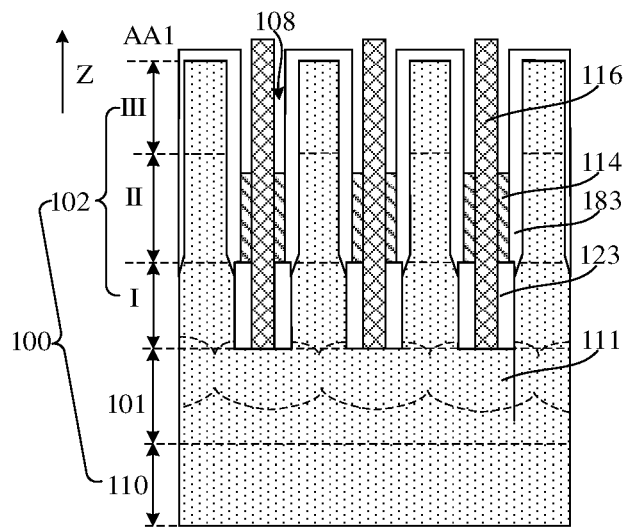
Figure 15:
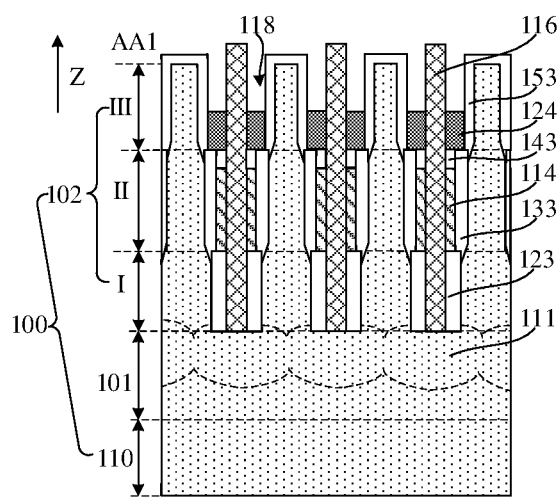

With reference to FIGS. 14 and 15, a third dielectric layer 133 and a first gate layer 114 are formed sequentially on the sidewall of the trench 107 (with reference to FIG. 11) in the second region II, where a top surface of the third dielectric layer 133 is higher than that of the first gate layer 114. A fourth dielectric layer 143 is formed, and located between the first insulating layer 116 and the third dielectric layer 133. A fifth dielectric layer 153 and a second gate layer 124 are formed sequentially on the sidewall of the trench 107 in the third region III, where a top surface of the fifth dielectric layer 153 is higher than that of the second gate layer 124.

In some embodiments, the step of forming the third dielectric layer 133 and the first gate layer 114 may include the following steps.

With reference to FIGS. 14 and 15, an initial third dielectric layer 183 is formed on the sidewalls of the vertical transistor structures 102 in the second region II and the third region III, and a second gap 108 is formed between the initial third dielectric layer 183 and the first insulating layer 116. The material of the initial third dielectric layer 183 is silicon oxide. The first gate layer 114 is formed in the second gap 108 in the second region II. An initial fourth dielectric layer (not shown in the figure) is formed in the remaining second gap 108. The first insulating layer 116 is used as a mask to etch the initial third dielectric layer 183 and the initial fourth dielectric layer, to form the third dielectric layer 133 and the fourth dielectric layer 143.

With reference to FIG. 15, the fifth dielectric layer 153 is formed on the sidewall of the third region III, and a third gap 118 is formed between the fifth dielectric layer 153 and the first insulating layer 116. A second gate layer 124 is formed in a part of the third gap 118.

Figure 16:
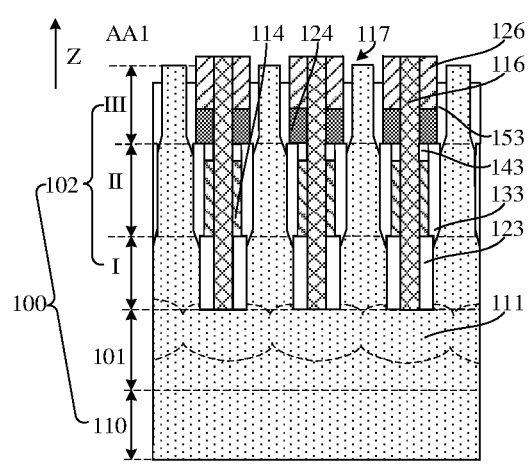

With reference to FIG. 16, the method of manufacturing the semiconductor structure may further include: forming a second insulating layer 126 located between the first insulating layer 116 and the fifth dielectric layer 153.

In some embodiments, with reference to FIGS. 3, 4, and 16, the step of forming the electrical connection layer 105 may include: etching the fifth dielectric layer 153 by using the first insulating layer 116 and the second insulating layer 126 as a mask, to expose the top surface and a partial sidewall of the third region III, and form a groove 117 between the second insulating layer 126 and the third region III; and forming the electrical connection layer 105 filling up the groove 117.

In some embodiments, with reference to FIGS. 3, 4, 6, 8, 17, and 21, the forming an electrical connection structure 104 may include: forming at least one opening 109 in the peripheral region 120, where each opening 109 exposes a partial region of the first gate layer 114 or the second gate layer 124; and forming the electrical connection structure 104 filling up the opening 109. It should be noted that, in some embodiments, the opening for preparing the electrical connection structure 104 and the groove 117 for preparing the electrical connection layer 105 may be formed in the same preparation process.

Figure 17:
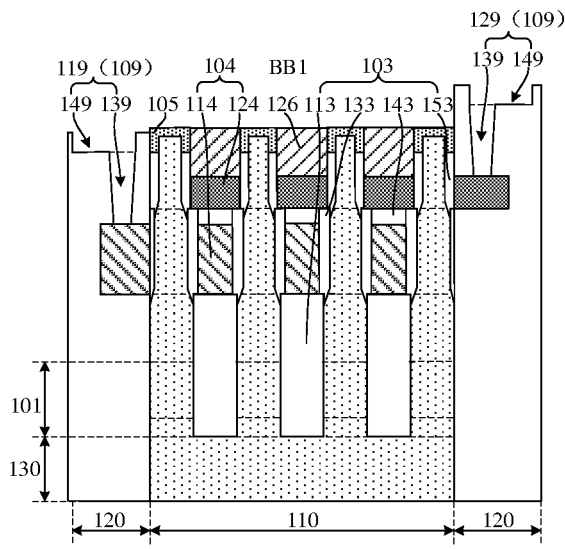

In some embodiments, with reference to FIG. 17, the array region 110 has a first side and the second side that are opposite to each other. A first opening 119 is formed in the peripheral region 120 close to the first side of the array region 110. The first opening 119 is configured to form the first electrical connection structure 134 (with reference to FIG. 3). A second opening 129 is formed in the peripheral region 120 close to the second side of the array region 110. The second opening 129 is configured to form the second electrical connection structure 144 (with reference to FIG. 3). It should be noted that, in practical applications, the first opening 119 and the second opening 129 may be formed in the same process step.

The first opening 119 includes a first through hole 139 exposing a part of the first gate layer 114 and a second groove 149 in communication with the first through hole 139. The second opening 129 includes a first through hole 139 exposing a part of the second gate layer 124 and a second groove 149 in communication with the first through hole 139. The first through hole 139 is configured to form the conductive pillar 154 (with reference to FIG. 3), and the second groove 149 is configured to form the conductive layer 164 (with reference to FIG. 3).

In some embodiments, with reference to FIGS. 3 and 17, the protective layer 140 is formed first on the sidewall of the first through hole 139, and then the connecting pillar 194 filling up the first through hole 139 is formed. The protective layer 140 and the connecting pillar 194 jointly form the conductive pillar 154; and then the conductive layer 164 filling up the second groove 149 is formed.

The protective layer 140 may be formed by using the following process steps: performing a deposition process to form a protective film covering the second groove 149 and the first through hole 139; removing the protective film located on the sidewall and bottom surface of the second groove 149, where the remaining protective film is taken as the protective layer 140. In some examples, the material of the protective film may be titanium nitride.

Figure 18:
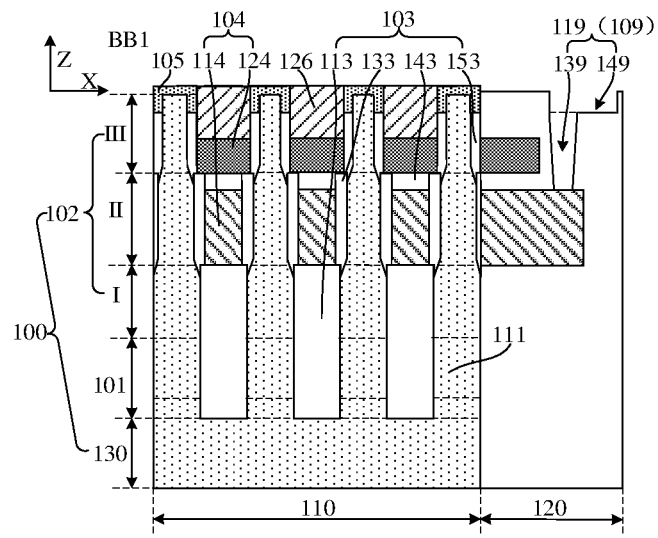

In some other embodiments, with reference to FIG. 18, the array region 110 has a first side and the second side that are opposite to each other. A first opening 119 is formed in the peripheral region 120 close to the first side of the array region 110. The first opening 119 is configured to form the first electrical connection structure 134 (with reference to FIG. 4). The first opening 119 includes a first through hole 139 exposing a part of the first gate layer 114 and a second groove 149 in communication with the first through hole 139.

Figure 19:
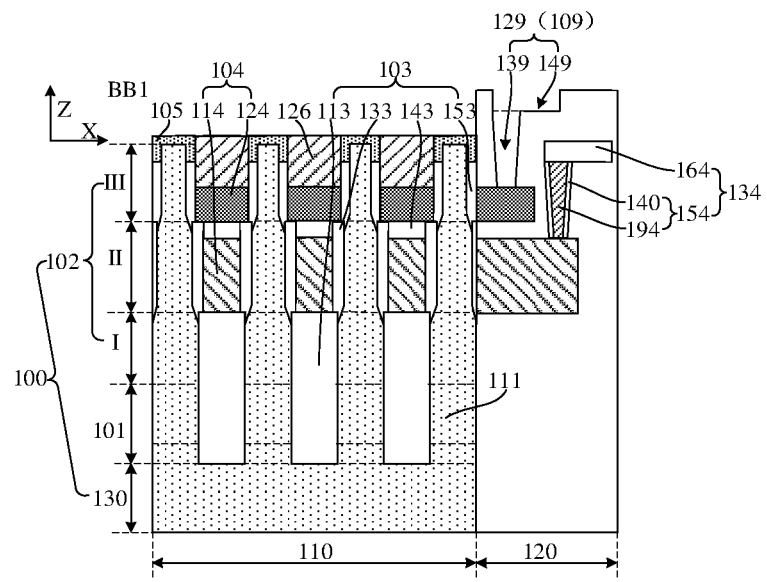

With reference to FIGS. 19 and 18, the protective layer 140 is formed first on the sidewall of the first through hole 139 in the first opening 119, and then the connecting pillar 194 filling up the first through hole 139 in the first opening 119 is formed. The protective layer 140 and the connecting pillar 194 jointly form the conductive pillar 154; and then the conductive layer 164 filling up the second groove 149 in the first opening 119 is formed.

With reference to FIG. 19, after the first electrical connection structure 134 is formed, a second opening 129 is formed in the peripheral region 120 close to the first side of the array region 110. The second opening 129 is configured to form the second electrical connection structure 144 (with reference to FIG. 4). The second opening 129 includes a first through hole 139 exposing a part of the second gate layer 124 and a second groove 149 in communication with the first through hole 139.

With reference to FIGS. 4 and 19, the protective layer 140 is formed first on the sidewall of the first through hole 139 in the second opening 129, and then the connecting pillar 194 filling up the first through hole 139 in the second opening 129 is formed. The protective layer 140 and the connecting pillar 194 jointly form the conductive pillar 154; and then the conductive layer 164 filling up the second groove 149 in the second opening 129 is formed.

The protective layer 140 may be formed by using the following process steps: performing a deposition process to form a protective film covering the second groove 149 and the first through hole 139; removing the protective film located on the sidewall and bottom surface of the second groove 149, where the remaining protective film is taken as the protective layer 140. In some examples, the material of the protective film may be titanium nitride.

Figure 20:
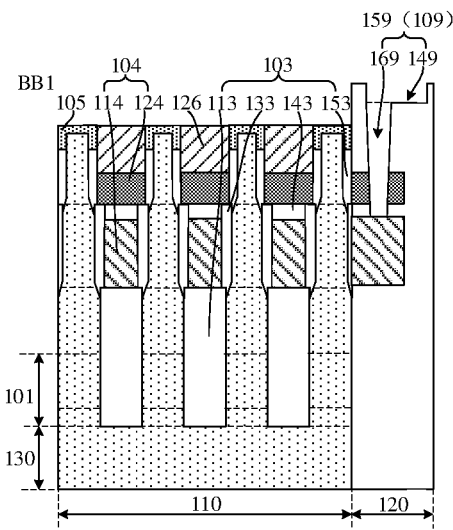

In some other embodiments, with reference to FIG. 20, a third opening 159 is formed in the peripheral region 120, and the third opening 159 is used to form the electrical connection structure 104 (with reference to FIG. 6). The third opening 159 includes a second through hole 169 penetrating through the second gate layer 124 and exposing a part of the first gate layer 114 and a second groove 149 in communication with the second through hole 169.

With reference to FIGS. 6 and 20, the protective layer 140 is formed first on the sidewall of the second through hole 169 in the third opening 159, and then the connecting pillar 194 filling up the second through hole 169 in the third opening 159 is formed. The protective layer 140 and the connecting pillar 194 jointly form the conductive pillar 154; and then the conductive layer 164 filling up the second groove 149 in the third opening 159 is formed.

The protective layer 140 may be formed by using the following process steps: performing a deposition process to form a protective film covering the second groove 149 and the second through hole 169; removing the protective film located on the sidewall and bottom surface of the second groove 149, where the remaining protective film is taken as the protective layer 140. In some examples, the material of the protective film may be titanium nitride.

Figure 21:
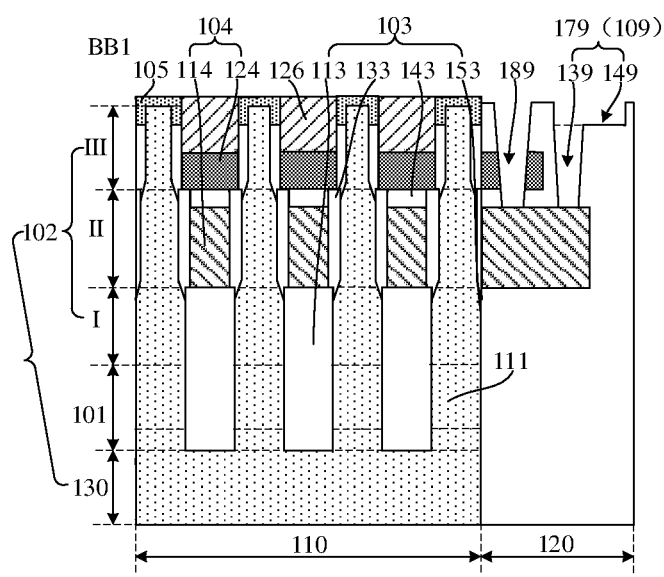

In some other embodiments, with reference to FIG. 21, a fourth opening 179 and a fifth opening 189 are formed in the peripheral region 120, and the fourth opening 179 is configured to form the electrical connection structure 104 (with reference to FIG. 8). The fifth opening 189 is configured to form the second conductive pillar 184 (with reference to FIG. 8). The fourth opening 179 includes a first through hole 139 exposing a part of the first gate layer 114 and a second groove 149 in communication with the first through hole 139. The fifth opening 189 penetrates through the second gate layer 124 and exposes a part of the first gate layer 114, and the fourth opening 179 and the fifth opening 189 are arranged at intervals.

With reference to FIGS. 6 and 21, the protective layer 140 is first formed on the sidewall of the first through hole 139 and the sidewall of the fifth opening 189. Then, the connecting pillar 194 filling up the first through hole 139 and the connecting pillar 194 filling up a part of the fifth openings 189 are formed. The protective layer 140 and the connecting pillar 194 filling up the first through hole 139 jointly form the first conductive pillar 174. The protective layer 140 and the connecting pillar 194 filling up a part of the fifth opening 189 jointly form the second conductive pillar 184. Then, a conductive layer 164 filling up the second groove 149 is formed The protective layer 140 may be formed by using the following process steps: performing a deposition process to form a protective film covering the fourth opening 179 and the fifth opening 189; removing the protective film located on the sidewall and bottom surface of the second groove 149, where the remaining protective film is taken as the protective layer 140. In some examples, the material of the protective film may be titanium nitride.

It should be noted that, in the practical application, in the step of forming the second conductive pillar 184 in the fifth opening 189, an initial second conductive pillar filling up the fifth opening 189 may be formed first. Then, the initial second conductive pillar is etched until the top surface of the initial second conductive pillar is not higher than the top surface of the second gate layer 124. The remaining initial second conductive pillar is taken as the second conductive pillar 184.

In summary, the first gate layer 114 and the second gate layer 124 both extend to the peripheral region 120. The electrical connection structure 104 is prepared in the peripheral region 120, and the potential of the first gate layer 114 and the potential of the second gate layer 124 are controlled through the electrical connection structure 104. In this way, the control over the potential of the first gate layer 114 and the potential of the second gate layer 124 can be diversified, and the layout space of the vertical transistor structures 102 in the array region 110 is not affected.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and the manufacturing method thereof provided by the embodiments of the present disclosure, vertical GAA transistors are formed in the base, the first gate layer and the second gate layer both surround the vertical transistor structure, such that a double-gate semiconductor structure can be formed, and the vertical transistor structures are arranged in a $4F^2$ manner, thereby improving the integration density of the conductor structure. Moreover, the first gate layer and the second gate layer are designed to jointly control the same vertical transistor structure, such that the abilities of the first gate layer and the second gate layer to control the vertical transistor structure complement each other. When the ability of one of the gate layers to control the vertical transistor structure is low, the other gate layer controls the vertical transistor structure to compensate for the deficiency. This is beneficial to further enhancing control of the first gate layer and the second gate layer over the vertical transistor structure, thereby effectively suppressing the short channel effect, reducing the leakage current in the vertical transistor structure, and increasing the current of the first gate layer and the second gate layer to control the vertical transistor structure on the whole. The first gate layer and the second gate layer both extend to the peripheral region, and the potential of the first gate layer and the potential of the second gate layer are controlled through the electrical connection structure in the peripheral region. In this way, the control over the potential of the first gate layer and the potential of the second gate layer can be diversified, and the layout space of the vertical transistor structures in the array region is not affected.

The invention claimed is:

1. A semiconductor structure, comprising:
   a base, wherein the base is provided with an array region and a peripheral region, the array region is provided with vertical transistor structures, the vertical transistor structures are arranged in an array in the array region, and the peripheral region surrounds the array region;
   a first gate layer surrounding the vertical transistor structure and extending along a first direction;
   a second gate layer surrounding the vertical transistor structure and extending along the first direction, wherein the second gate layer and the first gate layer surround a same vertical transistor structure, are disposed at intervals, and both extend to the peripheral region; and
   an electrical connection structure located in the peripheral region and electrically connected to the first gate layer and the second gate layer;
   wherein the electrical connection structure comprises: a conductive pillar and a conductive layer, the conductive pillar has one end electrically connected to at least one of the first gate layer or the second gate layer, and the other end electrically connected to conductive layer, the conductive pillar comprises: a connecting pillar and a protective layer surrounding a sidewall of the connecting pillar, and the conductive pillar and the protective layer are made of different materials.

2. The semiconductor structure according to claim 1, wherein the electrical connection structure comprises:
   a first electrical connection structure electrically connected to the first gate layer extending to the peripheral region; and
   a second electrical connection structure electrically connected to the second gate layer extending to the peripheral region, wherein the first electrical connection structure and the second electrical connection structure are disposed at intervals.

3. The semiconductor structure according to claim 2, wherein the array region has a first side and a second side that are opposite to each other, the first electrical connection structure is located in the peripheral region close to the first side, and the second electrical connection structure is located in the peripheral region close to the second side.

4. The semiconductor structure according to claim 2, wherein the array region has a first side and a second side that are opposite to each other, and the first electrical connection structure and the second electrical connection structure are both located in the peripheral region close to the first side or the second side.

5. The semiconductor structure according to claim 1, wherein along the first direction, a length of the first gate layer in the peripheral region is not the same as a length of the second gate layer in the peripheral region.

6. The semiconductor structure according to claim 1, wherein one first gate layer and one second gate layer are electrically connected to a same electrical connection structure, and the first gate layer and the second gate layer that are electrically connected to the same electrical connection structure are located in a same gap between adjacent two of the vertical transistor structures.

7. The semiconductor structure according to claim 6, wherein the electrical connection structure comprises: a conductive pillar and a conductive layer, the conductive pillar extends along a direction perpendicular to a top surface of the base, the conductive pillar has one end electrically connected to the first gate layer, and the other end electrically connected to the conductive layer, and the conductive pillar penetrates through the second gate layer.

8. The semiconductor structure according to claim 6, wherein the electrical connection structure comprises: a first conductive pillar and a conductive layer, wherein the first conductive pillar has one end electrically connected to the first gate layer, and the other end electrically connected to the conductive layer; and a second conductive pillar, having one end electrically connected to the first gate layer, and the other end electrically connected to the second gate layer, wherein the second conductive pillar and the first conductive pillar are disposed at intervals.

9. The semiconductor structure according to claim 1, wherein the base in the array region further comprises bit lines arranged at intervals, the bit line extends along a second direction, the vertical transistor structure is located on a partial top surface of the bit line, in a direction perpendicular to the top surface of the bit line, the vertical transistor structure comprises a first region, a second region, and a third region that are arranged sequentially, and the first direction and the second direction are different; and the semiconductor structure further comprises: a dielectric layer located between adjacent two of the bit lines and on a sidewall of the vertical transistor structure, the first gate layer surrounds the dielectric layer in the second region, and the second gate layer surrounds the dielectric layer in the third region.

10. The semiconductor structure according to claim 9, further comprising: an electrical connection layer covering a top surface of the third region and extending to a partial sidewall of the vertical transistor structure, wherein the electrical connection layer and the dielectric layer jointly cover a surface of the vertical transistor structure.

11. The semiconductor structure according to claim 10, wherein orthographic projection of the electrical connection layer on the bit line is not overlapped with or partially overlapped with orthographic projection of the second gate layer on the bit line.

12. The semiconductor structure according to claim 9, further comprising: an insulating layer located between adjacent vertical transistor structures on a same bit line, wherein the insulating layer isolates the first gate layer and the second gate layer on adjacent dielectric layers.

13. The semiconductor structure according to claim 12, further comprising a metal-semiconductor compound structure at least located in a bit line opposite to a bottom of the insulating layer.

* * * * *